United States Patent [19]

Atsumi

[11] Patent Number: 5,940,322

[45] Date of Patent: Aug. 17, 1999

[54] CONSTANT VOLTAGE GENERATING CIRCUIT WITH IMPROVED LINE VOLTAGE CONTROL

[75] Inventor: Shigeru Atsumi, Yokohama, Japan

[73] Assignee: Kabushiki Kaisha Toshiba, Kawasaki, Japan

[21] Appl. No.: 08/987,583

[22] Filed: Dec. 9, 1997

[30] Foreign Application Priority Data

Dec. 19, 1996 [JP] Japan .................................. 8-339948

[51] Int. Cl.$^6$ .................................................. G11C 16/04
[52] U.S. Cl. ............................ 365/185.18; 365/189.09
[58] Field of Search ........................... 365/185.18, 185.2, 365/210, 189.09; 323/315

[56] References Cited

U.S. PATENT DOCUMENTS

| | | | |
|---|---|---|---|
| 4,802,138 | 1/1989 | Shimamune | 365/210 |
| 5,296,801 | 3/1994 | Ohtsuka et al. | 323/313 |
| 5,608,676 | 3/1997 | Medlock et al. | 365/189.09 |
| 5,642,308 | 6/1997 | Yoshida | 365/185.12 |

*Primary Examiner*—David Nelms
*Assistant Examiner*—Hoai V. Ho
*Attorney, Agent, or Firm*—Banner & Witcoff, Ltd.

[57] ABSTRACT

A control circuit incorporated in a constant-voltage generating circuit receives a control signal. While the control signal is inactive, the control circuit sets the first and second nodes at the ground level and deactivates the current mirror circuit. When the control signal is activated, the control circuit releases the first and second nodes from the ground level and activates the current mirror circuit. Thus, no transient excessive charging of the bit line occurs immediately after the circuit is activated, and no soft-writing of data takes place.

13 Claims, 7 Drawing Sheets

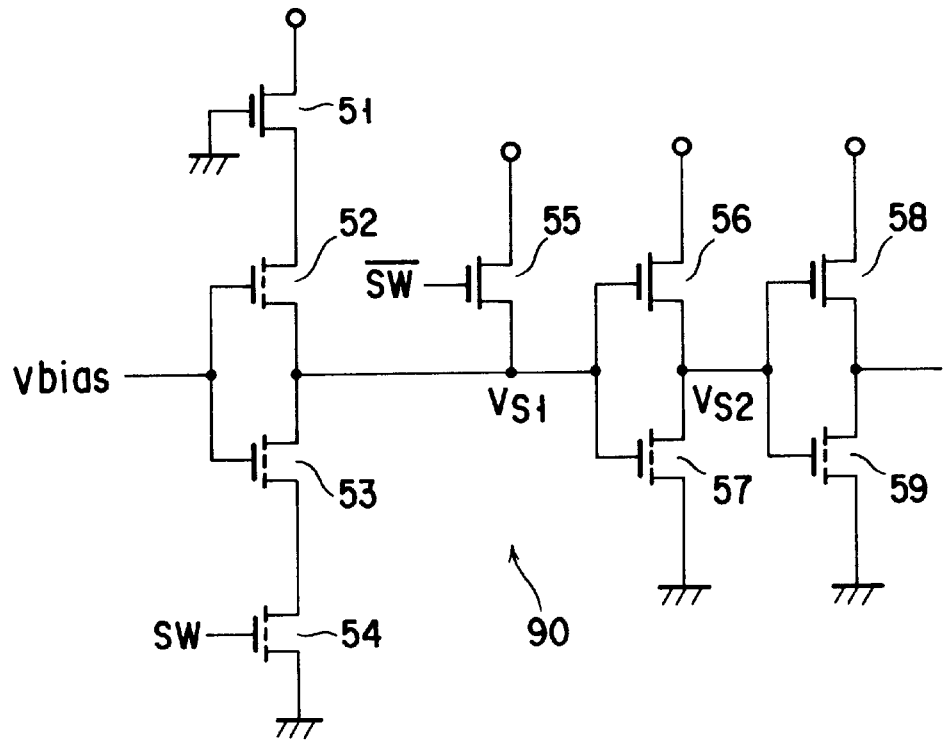
F I G. 14
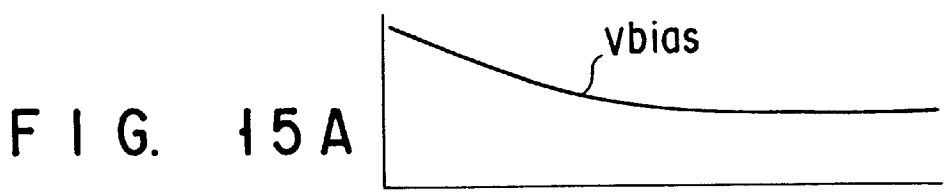
F I G. 15 A
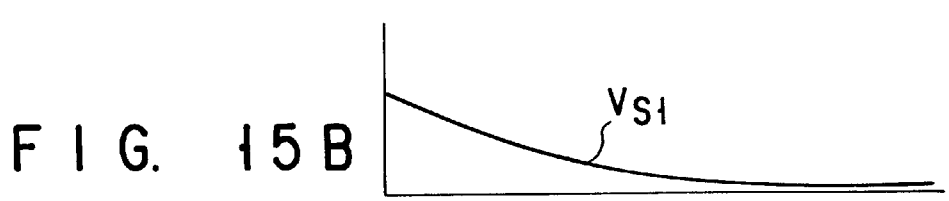
F I G. 15 B
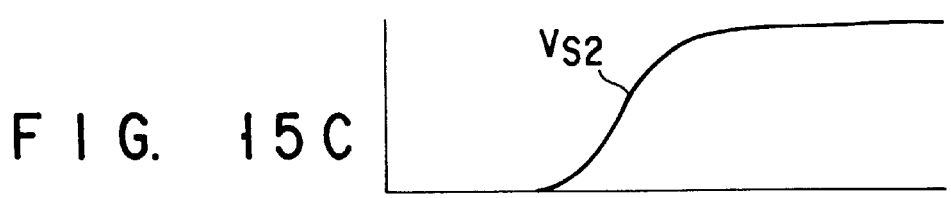
F I G. 15 C

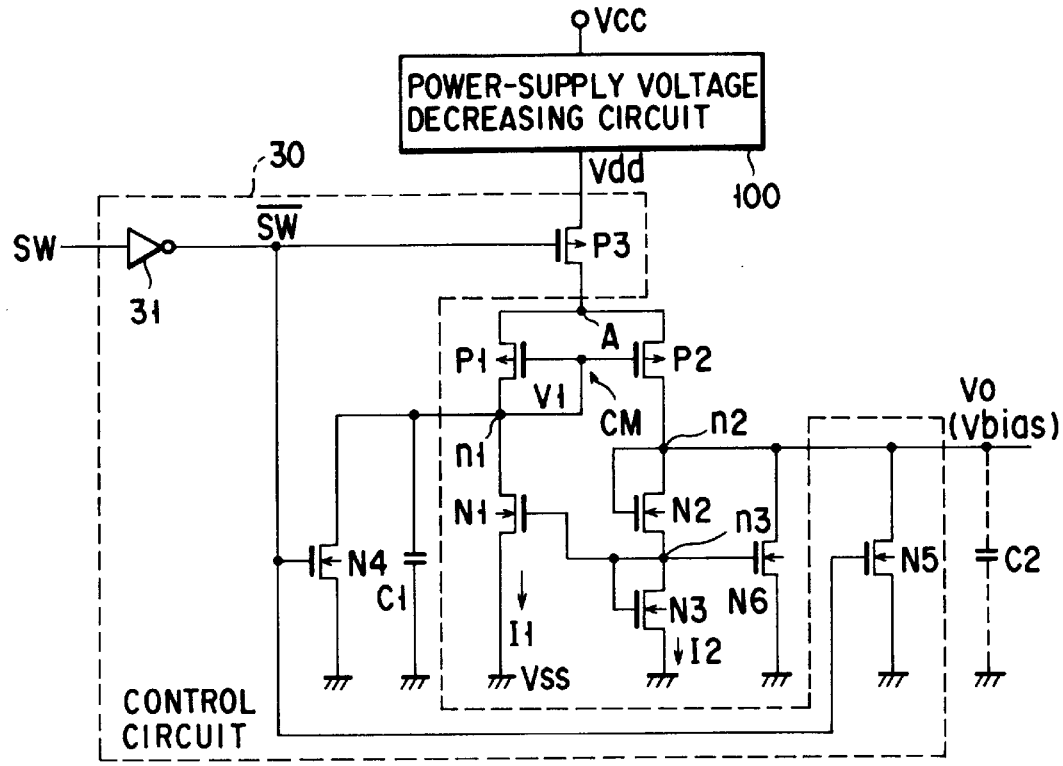
F I G. 16
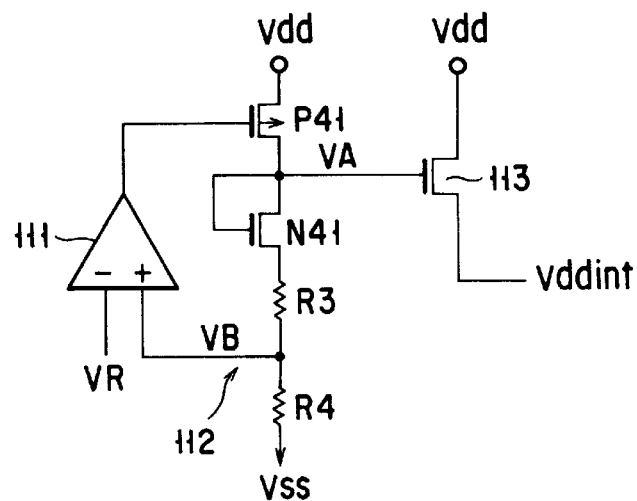
F I G. 17A
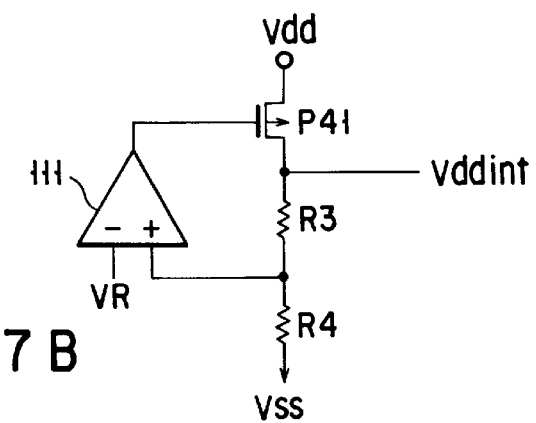
F I G. 17B

CONSTANT VOLTAGE GENERATING CIRCUIT WITH IMPROVED LINE VOLTAGE CONTROL

BACKGROUND OF THE INVENTION

The present invention relates to a nonvolatile semiconductor memory device and, more particularly, to an EPROM (Erasable and Programmable Read-Only Memory) or an EEPROM (Electrically Erasable and Programmable Read-Only Memory), and also to a constant-voltage generating circuit for use therein as a bit-line bias circuit.

Generally, in an EPROM and a flash EEPROM, one MOS transistor is connected between a bit-line load circuit and each bit line connected to memory cells, for clamping the bit-line potential at the time of reading data from the memory cells. A bias voltage is applied to the gate of the MOS transistor from a constant-voltage generating circuit. The constant-voltage generating circuit is generally known as "bit-line bias circuit".

FIG. 1 shows the basic structure of a constant-voltage generating circuit which is described in Jpn. Pat. Appln. KOKAI Publication No. 9-082094. All MOS transistors incorporated in this circuit are of enhancement type. Since the circuit has no depletion-type transistors, impurities need not be diffused into the channel region of each transistor to impart a low threshold voltage thereto. Hence, the constant-voltage generating circuit can be manufactured in a fewer steps than otherwise.

As shown in FIG. 1, P-channel MOS (PMOS) transistors P1 and P2, which constitute a current mirror circuit, have their sources connected to a Vdd node. The gates of the transistors P1 and P2 are connected to each other and to the drain of the transistor P1. The drains of the transistors P1 and P2 are connected to the drains of NMOS transistors N1 and N2. The gates of the NMOS transistors N1 and N2 are connected to each other and to the drain of the PMOS transistor P2.

The source of the NMOS transistor N1 is connected to the ground. The source of the NMOS transistor N2 is connected to the node n1 of the gate and drain of an NMOS transistor N3. The source of the NMOS transistor N3 is connected to the ground.

The drain of the PMOS transistor P2 and the gate and drain of the NMOS transistor N2 are connected to one another, forming a node n0. It is from the node n0 that a voltage Vo is output, which will be used as a bias voltage Vbias. The NMOS transistor N1 functions as a constant-current source. The NMOS transistors N2 and N3 constitute a load circuit.

FIG. 2 illustrates the actual structure of the constant-voltage generating circuit.

As shown in FIG. 2, a PMOS transistor P3 is connected between the Vdd node and the PMOS transistor P1, and a PMOS transistor P4 is connected between the Vdd node and the PMOS transistor P2. The PMOS transistor P4 has its gate connected to the ground. The PMOS transistor P3 has its gate connected to receive a control signal SW through an inverter circuit IV.

An NMOS transistor N5 is connected between the ground and the node of the PMOS transistor P1 and the NMOS transistor N1. The NMOS transistor N5 has its gate connected to receive the control signal SW through the inverter circuit IV.

NMOS transistors N6 and N7 are connected, forming a series circuit. The series circuit is connected between the node n0 and the ground. The NMOS transistor N6 has its gate connected to the node n1. The NMOS transistor N7 has its gate connected to receive the control signal SW. The node of the NMOS transistors N6 and N7 is connected to the source of the NMOS transistor N3.

The operation of the circuit shown in FIG. 2 will be described, with reference to FIG. 3 which represents the waveform of the control signal SW and the waveform of the bias voltage Vbias.

When the chip enable signal is inactive, the control signal SW is at low (L) level. The output signal of the inverter circuit IV is at high (H) level. Hence, the PMOS transistor P3 is turned off, whereas the NMOS transistor N5 is turned on. Hence, the PMOS transistor P2 is turned on, too. The NMOS transistor N7, which receives the control signal SW, is turned off. As a result, the NMOS transistors N2, N3 and N6 are turned off. Since the PMOS transistor P2 is on, and the PMOS transistor P4 is always on, the voltage at the node n0, i.e., the bias voltage Vbias, is equal to the power-supply voltage Vdd.

On the other hand, when the chip enable signal is active, the control signal SW is at "H" level. The NMOS transistor N7 is turned on, whereby the NMOS transistors N2, N3 and N6 decrease the potential at the node n0 to the ground potential.

The NMOS transistor N6 serves to decrease the voltage Vbias quickly, or to raise the speed with which the potential at the node n0 changes. Thus, the bias voltage Vbias quickly falls from the power-supply voltage Vdd to the ground potential. Were the NMOS transistor N6 not provided, the potential at the node n0 could not change sufficiently fast.

When the control signal SW rises to "H" level, the output signal of the inverter circuit IV falls to "L" level. As a result, the PMOS transistor P3 is turned on, and the NMOS transistor N5 is turned off. The PMOS transistors P1 and P2 are turned on. That is, the current mirror circuit starts operating, whereby the constant-voltage generating circuit assumes its steady state. Then, the NMOS transistor N1 functions as a constant-current source, and the bias voltage Vbias changes to 1.7 V. The bias voltage Vbias no longer depends on the power-supply voltage Vdd. In other words, the circuit keeps generating a constant bias voltage of 1.7 V.

When the control signal SW falls to "L" level, the PMOS transistor P3 and the NMOS transistor N7 are turned off and the NMOS transistor N5 is turned on, as indicated above. The bias voltage Vbias therefore changes to the power-supply voltage Vdd.

The constant-voltage generating circuit shown in FIG. 2 may be incorporated in an EPROM, along with an equalizing circuit. The equalizing circuit short-circuits any selected bit line to the dummy bit line at prescribed time, equalizing the potentials of the bit line and the dummy bit line. This makes it possible to increase the speed at which data is read from the EPROM.

Furthermore, the EPROM may have an enhancement-type NMOS transistor connected between the Vdd node and the column selecting switch, for charging the bit lines, and an enhancement-type NMOS transistor connected between the Vdd node and a dummy column selecting switch, for charging the dummy bit line. In this case, the output voltage of the constant-voltage generating circuit (FIG. 2) may be supplied to the gates of both enhancement-type NMOS transistors.

The constant-voltage generating circuit shown in FIGS. 1 and 2 can assume two stable states. It assumes the first stable state while the NMOS transistor N1 and the PMOS transistor P2 are on, Vo=2 Vtn. It assumes the second stable state when Vo<Vtn, and V1>Vdd Vtp while I1=I2=0 (at the start of the circuit), where Vtn and Vtp are the threshold voltages of the transistors N1 and P2, respectively. That is, the circuit operates stably when Vo=0 V and, therefore both transistors N1 and P2 are off.

Needless to say, it is demanded that the constant-voltage generating circuit should remain in the first stable state as long as possible. To meet this demand, the bias voltage for the circuit is set at such a value that the voltages Vo and V1 are Vdd and 0 V, respectively (i.e., Vo=Vdd, V1=0 V), at the start of the circuit. More precisely, while the circuit remains in inactive state (that is, while the EPROM remains unselected), the control signal SW is at "L" level, the output signal of the inverter circuit IV is at "H" level, whereby the transistors N5, P2 and N7 remain on, on and off, respectively. When the control signal SW rises to "H" level to activate the circuit, the voltage Vo changes from Vdd toward 2 Vtn. When the circuit is activated, the bit-line potential VBL changes to Vo−Vtp.

If the voltage Vo (=Vdd) rises above 2 Vtn while the circuit remains inactive, the selected bit line will be excessively charged immediately after the circuit is activated. The voltage Vo (i.e., the bit-line potential VBL) momentarily remains at a value greater than 2 Vtn (Vo>2 Vtn) in terms of AC, though it is 2 Vtn in terms of DC while the circuit remains in the first stable state. Namely, the bit-line potential VBL momentarily rises above the value (Vo−Vtn−α), becoming excessively high, as will be explained in detail with reference to FIG. 4.

FIG. 4 is a timing chart illustrating how the bit-line potential VBL changes with time right after the constant-voltage generating circuit is activated. As may be understood from FIG. 4, the selected bit line is likely to be charged too much it the time the output voltage of the circuit needs a longer time to become stable than the time required to charge the bit line fully.

If the selected bit line will be excessively charged, the following two problems will arise:

(1) Soft Writing of Data

As mentioned above, the constant-voltage generating circuit is designed to clamp the bit-line potential below a predetermined value in order inhibit soft writing of data. If the bit line is excessively charged, however, the bit-line potential will become too high, causing erroneous writing of data into the selected memory cell.

(2) Reduction of Data-Reading Speed

Once the bit line is charged excessively, it takes much time to discharge the bit line to read data from the memory cell. In other words, the access time of the EPROM, i.e., the data-reading time, inevitably become longer.

As described above, the output voltage Vo (=Vdd) of the conventional constant-voltage generating circuit is higher than 2 Vtn while the circuit remains inactive. Immediately after the circuit is activated, the bit line is charged to excess. Consequently, either soft-writing of data or a decrease in the data-reading speed will occur.

BRIEF SUMMARY OF THE INVENTION

Accordingly, it is an object of the present invention to provide a nonvolatile semiconductor memory device in which the bit lines are not charged excessively immediately after the constant-voltage generating circuit is activated and in which soft-writing of data and a decrease in the data-reading speed are prevented, and also to provide a constant-voltage generating circuit for applying a bias voltage to the bit lines of such a nonvolatile semiconductor memory device.

According to one aspect of the present invention, there is provided a constant-current generating circuit comprising: a first PMOS transistor having a source connected to a first power-supply node and a gate and a drain both connected to a first node; a second PMOS transistor having a source connected to the first power-supply node, a gate connected to the first node, and a drain connected to a second node which is an output node, the second PMOS transistor constituting a current mirror circuit, jointly with the first PMOS transistor; a first NMOS transistor having a drain connected to the first node, a gate connected to the second node, and a source connected to a second power-supply node, and constituting a constant current source; a second NMOS transistor having a drain and a gate both connected to the second node and a source connected to a third node; an active element connected between the third node and the second power-supply node; and a control circuit for setting the first and second nodes at the potential of the second power-supply node and deactivating the current mirror circuit in accordance with a control signal being inactive, and for releasing the first and second nodes from the potential of the second power-supply node and activating the current mirror circuit in accordance with a control signal being active.

In this constant-current generating circuit, the active element may be a third NMOS transistor which has a drain and a gate both connected to the third node, and a source connected to the second power-supply node.

According to another aspect of the present invention, there is provided a constant-voltage generating circuit comprising: a first PMOS transistor having a source connected to a first power-supply node and a gate and a drain both connected to a first node; a second PMOS transistor having a source connected to the first power-supply node, a gate connected to the first node, and a drain connected to a second node which is an output node, the second PMOS transistor constituting a current mirror circuit, jointly with the first PMOS transistor; a first NMOS transistor having a drain connected to the first node, a gate connected to a third node, and a source connected to a second power-supply node, and constituting a constant current source; a second NMOS transistor having a drain and a gate both connected to the second node and a source connected to the third node; a third NMOS transistor having a drain and gate connected to the third node, and a source connected to the second power-supply node; and a control circuit for setting the first and second nodes at the potential of the second power-supply node and deactivating the current mirror circuit in accordance with a control signal being inactive, and for releasing the first and second nodes from the potential of the second power-supply node and activating the current mirror circuit in accordance with a control signal being active.

In each of the above constant-voltage generating circuits, the control circuit may set the first node at the potential of the second power-supply node in accordance with the control signal being inactive, and may release the first node from the potential of the second power-supply node and slowly changes the potential of the first node in accordance with the control signal being active. In this case, the control circuit may include: a third PMOS transistor having a source-drain path connected between a power-supplying node and the first power-supply node, and a gate connected to receive a signal generated by inverting the control signal; a fourth NMOS transistor having a drain-source path connected between the first node and the second power-supply node, and a gate connected to receive the signal generated by inverting the control signal; a fifth NMOS transistor having a drain-source path connected between the second node and the second power-supply node, and a gate connected to receive a signal generated by inverting the control signal; and a first capacitor connected between the first node and the second power-supply node. It is desirable that a ratio between the capacitance C1 of the first capacitor and the capacitance C2 of a second capacitor which is a parasitic capacitance of the second node is equal to a ratio between the mutual conductances of the first and second PMOS transistors. Moreover, it is desirable that a ratio between the mutual conductances of the fourth and fifth NMOS transistors is equal to a ratio between the capacitance C2 of a second capacitor which is a parasitic capacitance of the second node and the capacitance C1 of the first node. The constant-voltage generating circuit may further comprise a sixth NMOS transistor having a drain-source path connected between the second node and the second power-supply node, and a gate connected to receive a signal from the third node.

According to a further aspect of the present invention, there is provided a nonvolatile semiconductor memory device comprising: a plurality of bit lines; a memory cell array having a plurality of nonvolatile memory cells arranged in rows and columns, for maintaining the bit lines at potentials, or discharging the bit lines to decrease the potentials thereof, in accordance with data stored in the memory cells; a column selecting switch connected to the bit lines, for selecting the memory cells; a first MOS transistor connected between the column selecting switch and a first node and having a gate connected to receive a bias voltage of a predetermined value; a first load circuit for charging the first node; a plurality of dummy bit lines; a dummy memory cell array for discharging the dummy bit lines, thereby decreasing the potential of the dummy bit lines; a dummy-column selecting switch connected to the dummy bit lines, for selecting the dummy bit lines; a second MOS transistor connected between the column selecting switch and a second node and having a gate connected to receive a bias voltage of a predetermined value; a second load circuit for charging the second node; a sense amplifier circuit for detecting and amplifying data read from any one of the memory cells which has been selected in accordance with a difference between the potentials of the first and second nodes; and a bit-line bias circuit for applying a bit-line bias voltage to the gates of the first and second MOS transistors, the bit-line bias circuit comprising MOS transistors of enhancement type only and designed to output a ground potential in accordance with a control signal being inactive, and to output a constant voltage lower than a power-supply voltage in accordance with a control signal being active, thereby turning on the first and second MOS transistors.

According to still a further aspect of the present invention, there is provided a nonvolatile semiconductor memory device comprising: a plurality of bit lines; a memory cell array having a plurality of nonvolatile memory cells arranged in rows and columns, for maintaining the bit lines at potentials, or discharging the bit lines to decrease the potentials thereof, in accordance with data stored in the memory cells; a column selecting switch connected to the bit lines, for selecting the memory cells; a first MOS transistor connected between the column selecting switch and a first node and having a gate connected to receive a bias voltage of a predetermined value; a first load circuit for charging the first node; a plurality of dummy bit lines; a dummy memory cell array for discharging the dummy bit lines, thereby decreasing the potential of the dummy bit lines; a dummy-column selecting switch connected to the dummy bit lines, for selecting the dummy bit lines; a second MOS transistor connected between the column selecting switch and a second node and having a gate connected to receive a bias voltage of a predetermined value; a second load circuit for charging the second node; a sense amplifier circuit for detecting and amplifying data read from any one of the memory cells which has been selected in accordance with a difference between the potentials of the first and second nodes; a bit-line bias circuit for applying a bit-line bias voltage to the gates of the first and second MOS transistors; and a delay circuit for delaying timing of raising a column selecting signal for controlling the column selecting switch, until the bit-line bias circuit is activated and outputs a stable voltage.

According to yet still a further aspect of the present invention, there is provided a nonvolatile semiconductor memory device comprising: a plurality of bit lines; a memory cell array having a plurality of nonvolatile memory cells arranged in rows and columns, for maintaining the bit lines at potentials, or discharging the bit lines to decrease the potentials thereof, in accordance with data stored in the memory cells; a column selecting switch connected to the bit lines, for selecting the memory cells; a first MOS transistor connected between the column selecting switch and a first node and having a gate connected to receive a bias voltage of a predetermined value; a first load circuit for charging the first node; a plurality of dummy bit lines; a dummy memory cell array for discharging the dummy bit lines, thereby decreasing the potential of the dummy bit lines; a dummy-column selecting switch connected to the dummy bit lines, for selecting the dummy bit lines; a second MOS transistor connected between the column selecting switch and a second node and having a gate connected to receive a bias voltage of a predetermined value; a second load circuit for charging the second node; a sense amplifier circuit for detecting and amplifying data read from any one of the memory cells which has been selected in accordance with a difference between the potentials of the first and second nodes; a bit-line bias circuit for applying a bit-line bias voltage to the gates of the first and second MOS transistors; and a current leakage circuit for supplying a leakage current from the bit lines to a ground node until the bit-line bias circuit is activated and outputs a stable voltage.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 14 is a circuit diagram of the drive circuit 90 shown in FIG. 13;

FIGS. 15A to 15C are waveform diagrams illustrating how three voltages change with time;

FIG. 16 is a modification of the constant-voltage generating circuit shown in FIG. 10; and FIGS. 17A and 17B are circuit diagrams showing two alternative voltage-decreasing circuits which may be used in the EPROM of FIG. 5.

DETAILED DESCRIPTION OF THE INVENTION

An embodiment of the present invention will be described with reference to the accompanying drawings.

Figure 5:
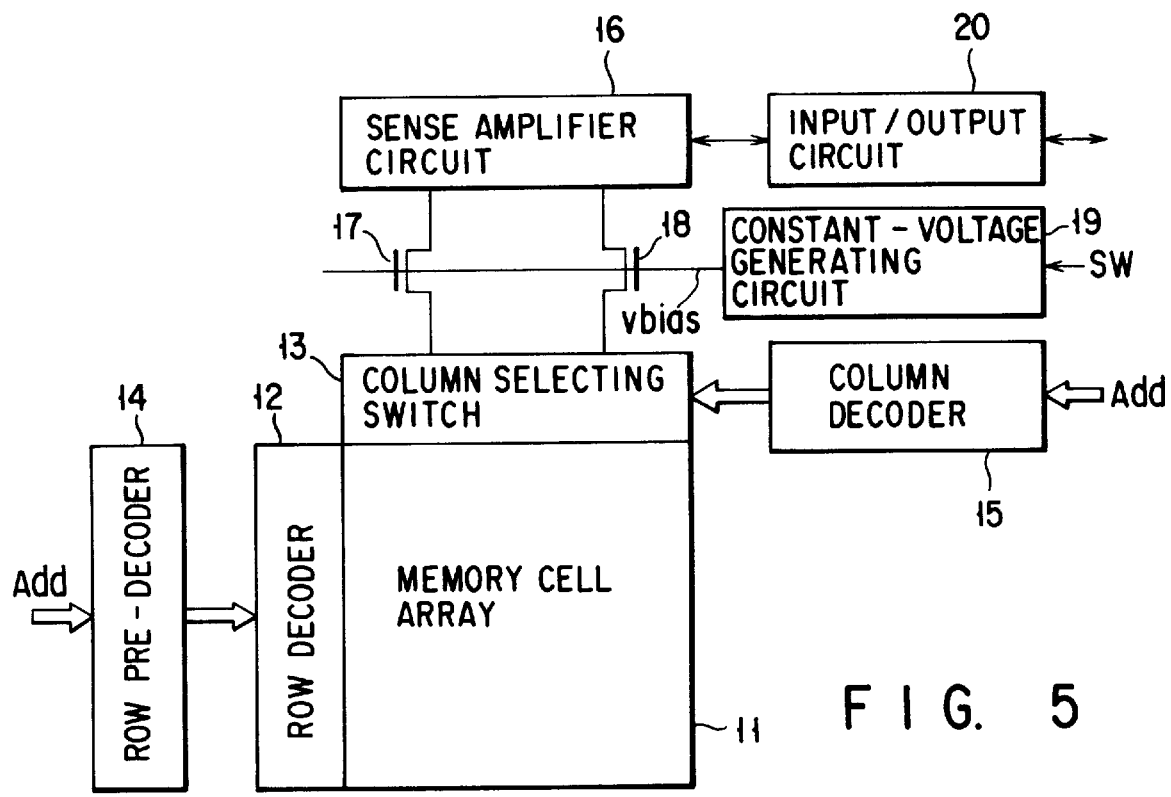
FIG. 5 is a block diagram showing a part of an EPROM which is an embodiment of a nonvolatile semiconductor memory device according to the present invention.
Figure 6:
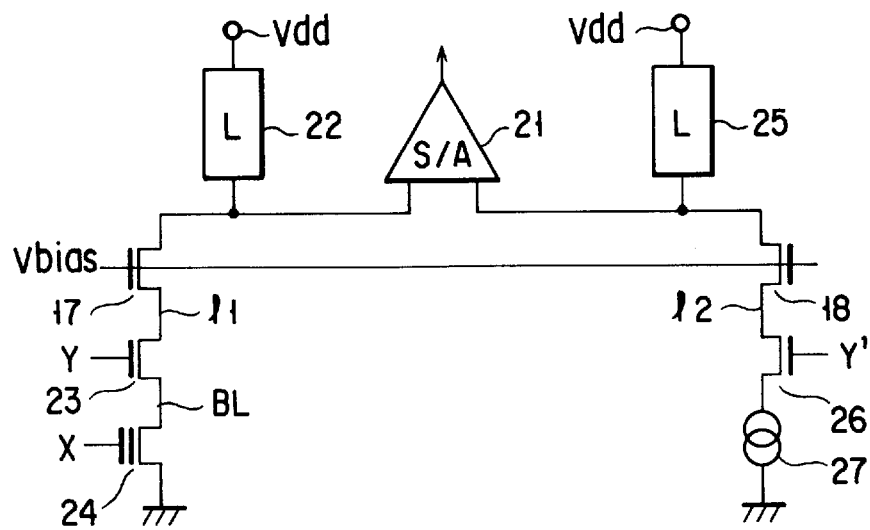
FIG. 6 is a circuit diagram illustrating an important section of the EPROM shown in FIG. 5.

FIG. 5 shows a part of an EPROM which is an embodiment of a nonvolatile semiconductor memory device according to this invention. FIG. 6 illustrates an important section of the EPROM.

As shown in FIG. 5, the EPROM comprises a memory cell array 11, a row decoder 12, a column selecting switch 13, a row pre-decoder 14, a column decoder 15, a sense amplifier circuit 16, transistors 17 and 18, a constant-voltage generating circuit 19, and an input/output circuit 20.

The memory cell array 11 has a plurality of memory cells (EPROM cells). The memory cells are arranged in rows and columns, forming a matrix of cells. Each memory cell has its source connected to, for example, the ground potential Vss. The gates of the memory cells of each row are connected one word line. The drains of the memory cells of each column are connected to one bit line.

The row decoder 12 is connected to the word lines of the memory cell array 11, for selecting one of the word lines in accordance with a row address Add. The column selecting switch 13 is connected to the bit lines of the memory cell array 11, for selecting one of the bit lines in accordance with a column address Add. Hence, the row decoder and the column selecting switch 13 cooperate to select one memory cell of the array 11. The row pre-decoder 14 is connected to the row decoder 12. The column decoder 15 is connected to the column selecting switch 13.

The transistor 17, which is an enhancement-type one, is connected between the column selecting switch 13 and the sense amplifier circuit 16, for clamping the bit-line potential. The transistor 18, which is also an enhancement type one, is connected between the switch 13 and the circuit 16, for clamping the dummy bit-line potential. The gates of the transistors 17 and 18 are connected to the output of the constant-voltage generating circuit 19. The circuit 19 generates a bias voltage Vbias of a predetermined value. The circuit 19 receives a control signal SW, which is a chip enable signal generated in the EPROM from a chip enable signal /CE supplied from an external device.

The sense amplifier circuit 16 has a differential sense amplifier and a write control circuit. The differential sense amplifier compares the data read from any selected memory cell with a reference potential (i.e., the data read from a dummy cell) and detects the data read from the memory cell. The sense amplifier circuit 16 is connected to the input/output circuit 20. The data detected by the circuit 16 is output through the input/output circuit 20. Data is input through the input/output circuit 20 to the sense amplifier circuit 16, so as to be written into the memory cell array 11.

As shown in FIG. 6, a load circuit (L) 22, the transistor 17, an enhancement-type transistor 23 provided in the column selecting switch 13, and a memory cell 24 are connected in series, forming a series circuit. The series circuit is connected between a Vdd node and the ground node. Reading potential Vdd is applied to the Vdd node, while the ground potential Vss is applied to the ground node.

Similarly, a load circuit (L) 25, the transistor 18, a transistor 26 provided in a dummy-column selecting switch, and a constant-current source 27 which functions as a dummy cell, forming a series circuit. This series circuit is connected between the Vdd node and the ground node.

The load circuits 22 and 25 may be enhancement-type P-channel transistors, one having its gate connected to the drain of the other. Instead, they may be enhancement-type P-channel transistors whose gates are connected to the Vss node. Alternatively, they may be enhancement-type N-channel transistors, one having its gate connected to the drain of the other.

The node of the load circuit 22 and the transistor 17 is connected to the first input terminal of the first input terminal of the sense amplifier 21 which is provided in the sense amplifier circuit 16. The node of the load circuit 25 and the transistor 18 is connected to the second input terminal of the sense amplifier 21.

The gates of the transistors 17 and 18 are connected to receive the bias voltage Vbias applied from the constant-voltage generating circuit 19. The gate of the transistor 23 is connected to receive the column selecting signal Y output from the column decoder 15. The gate of the transistor 26 is connected to receive a dummy column selecting signal Y'. The output signal X of the row decoder 12 is supplied to the word line which is connected to the control gate of the memory cell 24.

The memory cell 24 holds the potential of the bit line connected to it if the data it stores has the value of "1". If the data it holds has the value of "0", the memory cell 24 discharges the bit line, decreasing the potential thereof. The constant-current source 27 used as a dummy cell discharges the dummy bit line, decreasing the potential of the dummy bit line by a prescribed value, to read the data from the memory cell 24.

Figure 7:
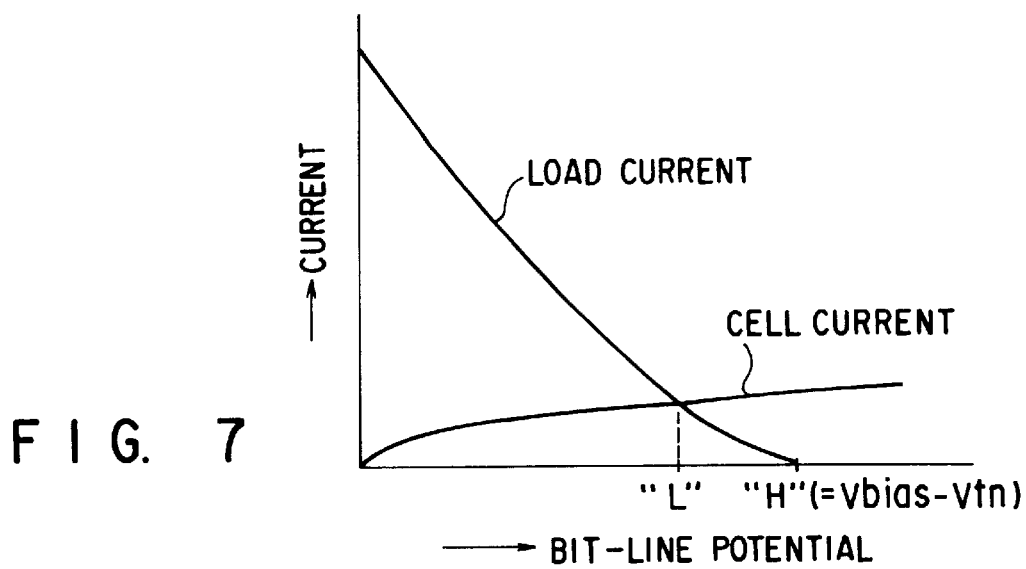
FIG. 7 is a graph representing the relationship the potential of the bit line shown in FIG. 6 has with the load current and the cell current.

FIG. 7 represents the relationship the bit-line potential has with the load current and the cell current while the data is being read from the memory cell 24. As seen from FIG. 7, the load current decreases as the bit-line potential increases. On the other hand, the cell current which flows in the memory cell 24 while the cell 24 remains on gradually increases as the bit-line potential increases.

The intersection of the two curves representing the changes in the load current and the cell current is the "L" level of the bit-line potential. The "H" level of the bit-line potential is Vbias−Vtn (Vtn is the threshold voltage of an NMOS transistor having substrate bias effect). When the bit-line potential is "H" level, the load current is zero.

All transistors used in the constant-voltage generating circuit 19 are of enhancement-type MOS transistors. The circuit 19 is designed to output the ground potential when the control signal SW (i.e., a chip enable signal) is inactive. When the control signal SW becomes active, the circuit 19 generates a constant voltage which is lower than the power-supply voltage. The constant voltage turns on the MOS transistors 17 and 18.

Figure 8:
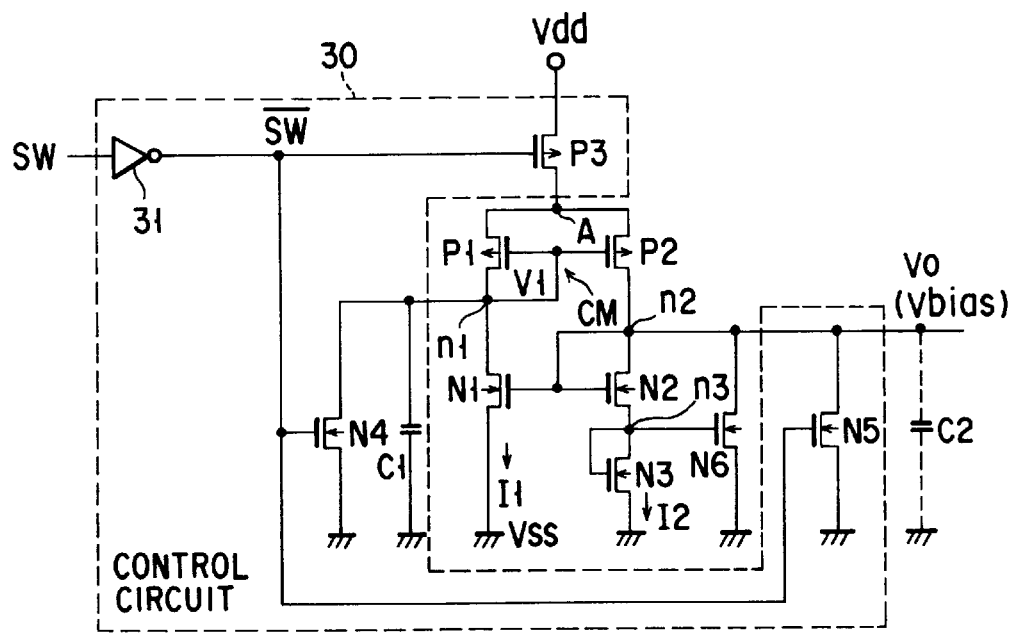
FIG. 8 is circuit diagram of a constant-voltage generating circuit according to the invention, which may be used as bit-line bias circuit in the EPROM of FIG. 5.

FIG. 8 shows a circuit which may be used as the constant-voltage generating circuit 19 shown in FIG. 5.

Figure 1:
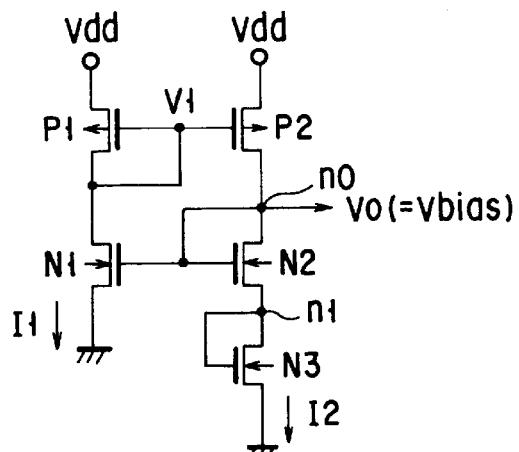
FIG. 1 is a circuit diagram showing the basic structure of a conventional constant-voltage generating circuit.
Figure 2:
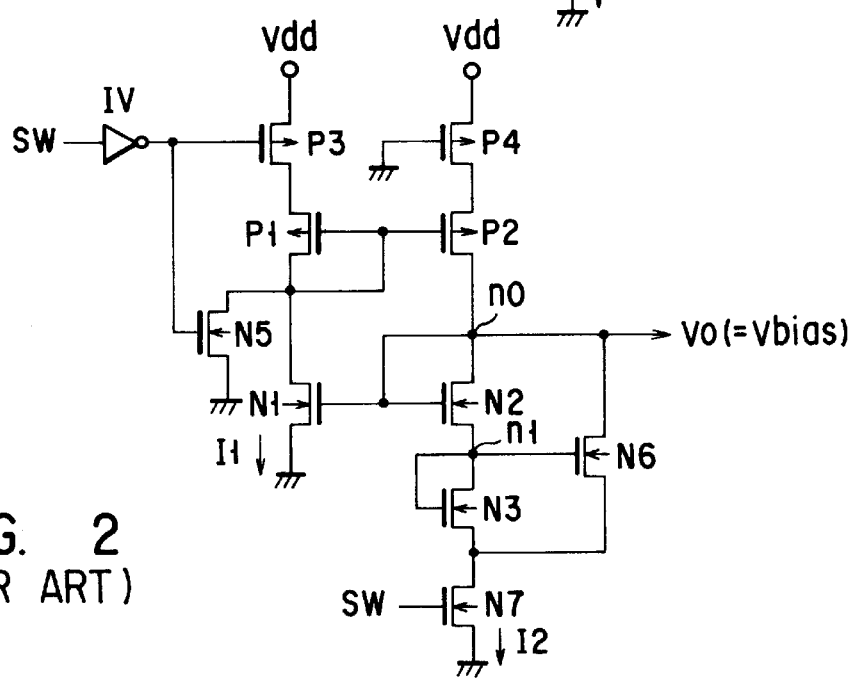
FIG. 2 is a circuit diagram illustrating the actual structure of the constant-voltage generating circuit of FIG. 1.
Figure 3:
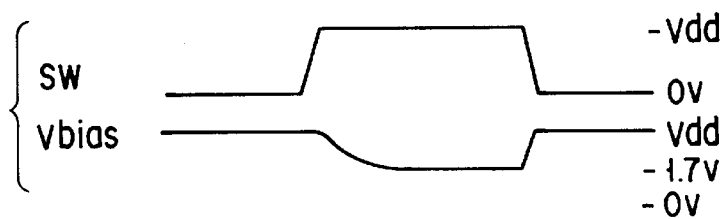
FIG. 3 is a diagram representing the waveforms of a control signal and bias voltage, explaining the operation of the constant-voltage generating circuit shown in FIG. 2.
Figure 4:
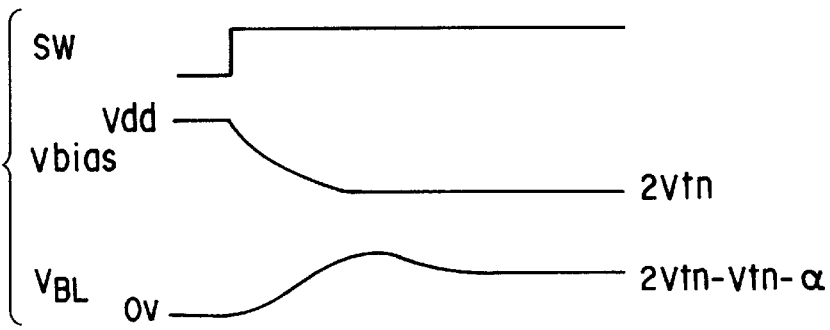
FIG. 4 is a timing chart illustrating how the bit-line potential changes with time immediately after the constant-voltage generating circuit is activated.

The constant-voltage generating circuit shown in FIG. 8 has the same basic structure as the conventional constant-voltage generating circuit illustrated in FIG. 1. It differs from the conventional circuit in that it has a control circuit 30.

As shown in FIG. 8, the first PMOS transistor P1 has its source connected to the first power-supply node (hereinafter referred to as "power-supply node A") and its gate and drain connected to the first node n1. The second PMOS transistor P2 has its source connected to the power-supply node A and its gate connected to the first node n1. The drain of the second PMOS transistor P2 is connected to the second node n2, which is the output terminal of the constant-voltage generating circuit. The first PMOS transistor P1 and the second PMOS transistor P2 constitute a current mirror circuit CM.

The first NMOS transistor N1 has its drain connected to the first node n1, its gate connected to the second node n2, and its source connected to the second power-supply node (hereinafter referred to as "ground node"). The first NMOS transistor N1 is a constant current source for the current mirror circuit CM. The second NMOS transistor N2 has its drain and gate connected to the second node n2 and its source connected to the third node n3.

An active element or a resistor is connected between the third node n3 and the ground node. In the present embodiment, the active element is the third NMOS transistor N3. The third NMOS transistor N3 has its drain and gate connected to the third node n3 and its source connected to the ground. The NMOS transistors N2 and N3 constitute a load circuit.

The control circuit 30 is connected to receive the control signal SW which activates or deactivates the constant-voltage generating circuit. When the signal SW is at a level to deactivate the constant-voltage generating circuit, the circuit 30 sets the first node n1 and the second node n2 at the ground-node potential (i.e., the ground potential), thereby deactivating the current mirror circuit CM. When the signal SW is at a level to activate the constant-voltage generating circuit, the circuit 30 gradually changes the potential of the first node n1 form the ground-node potential and releases the second node n2 from the ground-node potential, thereby activating the current mirror circuit CM. As indicated above, the control signal SW is generated in the EPROM from the chip enable signal supplied to the EPROM from the an external device.

As shown in FIG. 8, the control circuit 30 comprises an inverter circuit 31, a third PMOS transistor P3, a fourth NMOS transistor N4, a fifth NMOS transistor N5, and a first capacitor C1. The inverter circuit 31 inverts the control signal SW, generating a signal /SW. The third PMOS transistor P3 is connected between the power-supply node Vdd and the power-supply node A, with its gate connected to receive the signal /SW. The fourth PMOS transistor N4 is connected between the first node n1 and the ground node, with its gate connected to receive the signal /SW. The fifth NMOS transistor N5 has its drain-source path connected between the second node n2 and the ground node. The gate of the transistor N5 is connected to receive the signal /SW. The first capacitor C1 is connected between the first node n1 and the ground node.

The control circuit 30 may further comprise a sixth NMOS transistor N6 as shown in the figure. In this case, the sixth NMOS transistor N6 has its drain-source path connected between the second node n2 and the ground node. The gate of the transistor N6 is connected to receive a signal from the third node n3.

When the control signal SW supplied to the inverter circuit 31 is at "L" level (i.e., inactive), the PMOS transistor P3 is turned off by the signal /SW. At the same time, the NMOS transistors N4 and N5 are turned on by the signal /SW. The current mirror circuit CM is thereby deactivated. As a result, the first node n1 and the second node n2 are set at the ground potential.

Conversely, when the control signal SW is at "H" level (i.e., activated), the PMOS transistor P3 is turned on by the signal /SW. Simultaneously, the NMOS transistors N4 and N5 are turned off by the signal /SW. As a result, the first node n1 and the second node n2 are released from the ground potential. At this time, a current starts flowing in the PMOS transistors P1 and P2, because the gates of the transistors P1 and P2 are set at the potential of the first node n1. When the potential of the second node n2 rises above the threshold voltage Vtn of the NMOS transistors, a current starts flowing in the NMOS transistor N1, the gate of which is set at the potential of the second node n2. As a result, the current mirror circuit CM is activated.

Connected between the first node n1 and the ground node, the first capacitor C1 is charged immediately after the circuit CM is activated. The first capacitor C1 therefore increases the potential of the first node n1 but slowly. In other words, the increase in the potential of the first node n1 is inhibited until the potential of the second node n2 rises above the threshold voltage Vtn. The lower the potential of the first node n1, the faster the PMOS transistor P2 increases the potential of the second node n2. Hence, the current flowing through the second node n2 increases, raising the potential of the second node n2 at high speed.

The NMOS transistors N2 and N3 have high operating resistances immediately after the circuit CM is activated. Thus, the current from the PMOS transistor P2 flows through the NMOS transistors N2 and N3 in a small amount. To make a current flow through the transistors N2 and N3 in a large amount, the sixth NMOS transistor N6 has its drain-source path connected between the second node n2 and the ground node as described above. In other words, the sixth NMOS transistor N6 is provided in order to increase the potential of the second node n2 at a sufficiently high speed.

The parasitic capacitance of the second node n2 constitutes a second capacitor C2. If C1<<C2, the potential V1 of the first node n1 will reach Vdd−|vtp| before the potential Vo of the second rises above Vtn, immediately after the circuit CM is activated. The PMOS transistors P1 and P2 will then be turned off, and the circuit will fail to operate in the desired manner described above. On the other hand, it C2<<C1, the potential of the second node n2 may rise above the desired output voltage before the potential of the first node n1 becomes stable. It is therefore desired that the ratio of C1 to C2 be almost equal to the ratio between the mutual conductances gm1 and gm2 of the first and second PMOS transistors P1 and P2, C1:C2=gm1:gm2.

If C1:C2=gm1:gm2, the potentials of the first and second nodes n1 and n2 will increase in almost the same way to have a substantially identical waveform, immediately after the circuit CM is activated. More precisely, the PMOS transistor P2 will increase the potential of the second node n2 in the same way as the PMOS transistor P1 increases the potential of the first node n1 in proportion to the square of Vg−|Vtp|. The speed with which the potential of the second node n2 depends on the load characteristic of the PMOS transistor P2. This speed is much higher than in the case of a constant-current load.

If C1:C2=gm1:gm2, the potentials of the first and second nodes n1 and n2 will change in phase when the power-supply voltage Vdd has a noise. This increases the noise margin.

The ratio of C2 to C1 may be set almost equal to the ratio between the mutual conductances of the fourth and fifth NMOS transistors N4 and N5 which are provided to set the first and second nodes n1 and n2 at the ground potential while the control signal remains inactive temporarily. In this case, the changes in the potentials of the nodes n1 and n2 (i.e., time constants) are remains equal after the circuit CM has been deactivated. The circuit can therefore stably operates when activated again after it was deactivated due to noise. If the NMOS transistors N1 and N2 did not operate stably, the circuit will fall in an unstable operating state due to noise.

The constant-voltage generating circuit shown in FIG. 8 is simple in structure. Nonetheless, its output can be set at a low precharge state when the control signal is inactive, without reducing the operating speed. Therefore, no measures need not be taken to cope with the excessive charging of the bit line immediately after the control signal is activated. The constant-voltage generating circuit serves to simplify the data-reading circuit of the PROM, without lowering the performance of the data-reading circuit.

The PMOS transistors P1 and P2 controls the current I1 flowing through the NMOS transistor N1 and the current I2 flowing through the NMOS transistors N2 and N3 as long as the current mirror circuit CM remains activated. If the ratio of the mutual conductance of the PMOS transistor P1 to that of the PMOS transistor P2 is 1:2, the ratio of the current I1 to the current I2 will be also 1:2.

The output voltage Vo is determined by the load characteristics of the NMOS transistors N2 and N3 and the current I2. To control the output voltage Vo accurately, it is necessary to control the current I1.

Figure 9:
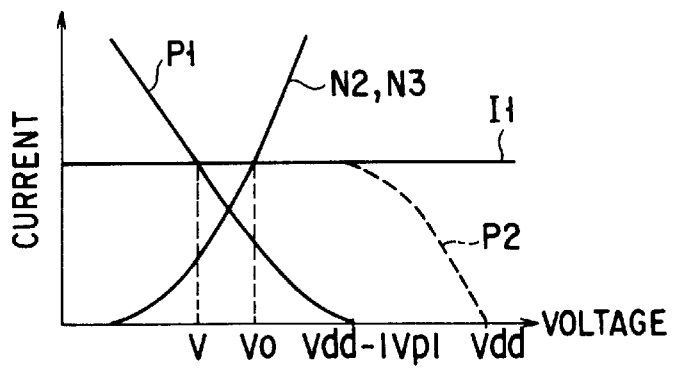
FIG. 9 is a graph representing the load characteristics which the PMOS transistors P1 and P1 used in the circuit of FIG. 8 exhibit when their conductance ratio is 1:1.

FIG. 9 represents the load characteristics which the PMOS transistors P1 and P1 exhibit if their conductance ratio is 1:1.

As indicated above, the output voltage Vo depends on the current I2 and the load characteristics of the NMOS transistors N2 and N3 connected in series. The NMOS transistors N2 and N3 are designed to have a load characteristic whose slope is infinitely steep. Then, the output voltage Vo at the second node n2 is about 2 Vtn, and the voltage V1 at the first node n1 is about Vtn. The voltages at the nodes n1 and n2 remains unchanged while the current mirror CM is operating. Thus, the NMOS transistor N1 functions as a constant current source if the voltage at the node n1 or n2 is applied to its gate.

The PMOS transistor P2 must operates in pentode region. Otherwise the contestant-voltage generating circuit could not operate. Hence, the following should be satisfied:

$$Vdd-Vo \geq Vdd-V1+|Vtp|>0$$

$$Vdd \geq 2Vtn+2|Vtp|$$

$$Vo=2Vtn+\alpha, V1=Vdd-|Vtp|$$

The power-supply voltage Vdd may be 3.3 V, the threshold voltage Vtn may be 0.6 V, and the voltage |Vtp| may be 0.7 V. If this is the case, the circuit can operates until the power-supply voltage Vdd falls below about 2.6 V. When Vdd≧2.6 V, the output voltage Vo becomes constant. The constant voltage Vo is output as the bias voltage Vbias.

In the constant-voltage generating circuit, the output voltage Vo at the second node n2 does not depend on the external power supply and therefore remains constant, and this voltage Vo is fed back to the gate of the first NMOS transistor N1. Obviously, the first NMOS transistor N1 makes a simple constant current source for the current mirror circuit CM.

A modification of the constant-voltage generating circuit shown in FIG. 8 will be described with reference to FIG. 10.

The modified circuit is identical in structure to the circuit of FIG. 8, except in that the gate of the NMOS transistor N1 is connected to the gate-drain path of the NMOS transistor N3. The components identical or similar to those of the circuit shown in FIG. 8 are designated at the same reference numerals and will not be described in detail.

Figure 10:
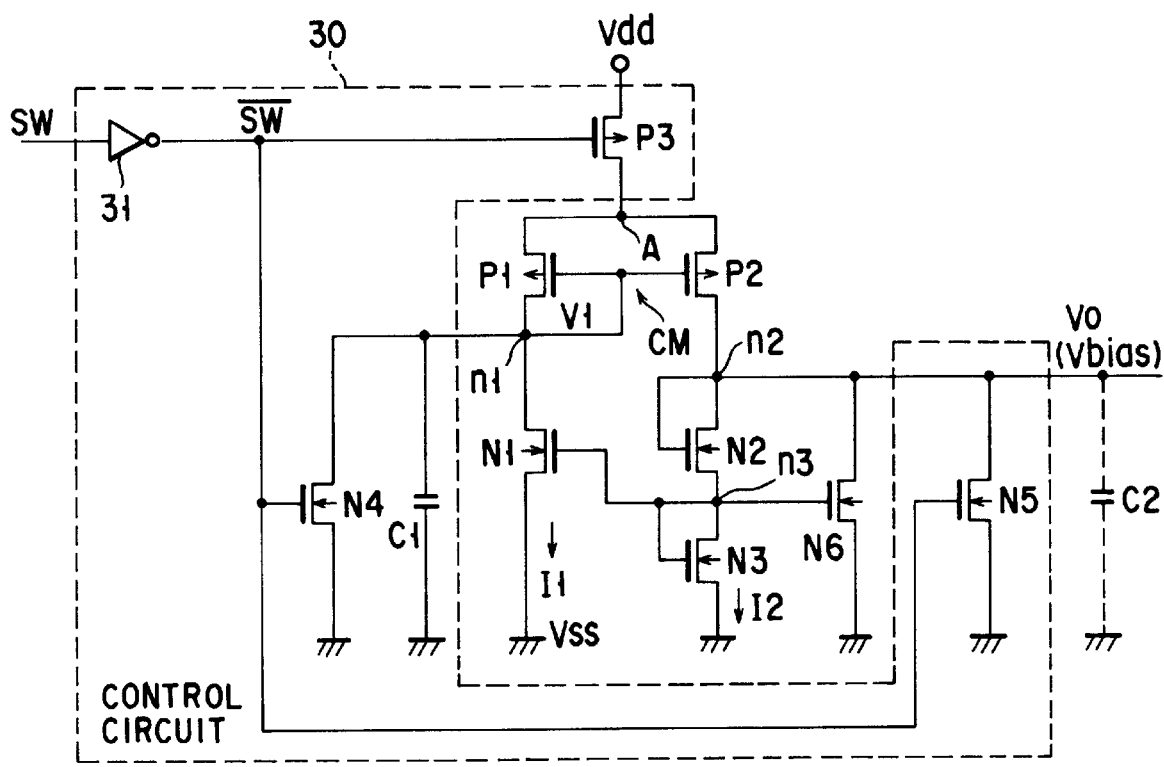
FIG. 10 is a circuit diagram illustrating a modification of the constant-generating circuit shown in FIG. 8.

The modified circuit shown in FIG. 10 operates basically in the same way as the constant-voltage generating circuit illustrated in FIG. 8, and generates a output voltage Vo (i.e., bias voltage Vbias) of about 1.7 V while normally operating. However, since the gate potential of the NMOS transistor N1 is lower than in the circuit of FIG. 8, the NMOS transistor N1 needs a longer time to be turned on. As a result, the potential V1 of the first node n1 rises faster than in the constant-voltage generating circuit of FIG. 8.

The constant-voltage generating circuit described above is designed to prevent transient excessive charging of the bit line immediately after the circuit is activated, thereby to avoid soft-writing of data and a decrease in the data-reading speed. To prevent the transient excessive charging of the bit line more reliably, one of the following alternative measures (1) to (3) may be taken in the EPROM.

(1) Until the output voltage of the constant-voltage generating circuit becomes stable after the circuit is activated, the column selecting signal Y is prohibited from rising from "L" level to "H" level. To prohibit this level rise of the signal Y, a signal delay circuit unit must be connected to the input or output of the column decoder. The use of the signal delay circuit unit makes the EPROM more complex in structure, however. Further, it is difficult to set the time at which the signal Y should rise to "H" level, and the access time may become longer if the signal Y rises to "H" level later than is desired.

(2) Until the output voltage of the constant-voltage generating circuit becomes stable after the circuit is activated (namely, until the voltage Vo falls from Vdd to 2 Vtn), a current leakage circuit is formed so that a leakage current may flow from the bit line to the ground node. It is difficult, however, to set the timings until the output voltage of the constant-voltage generating circuit becomes stable. Moreover, the access time may become longer if the leakage current flows for a comparatively long time.

(3) The power-supply voltage decreasing circuit provided in the EPROM is used as the power supply for the constant-voltage generating circuit, and its output voltage of the constant-voltage generating circuit.

Figure 11A:
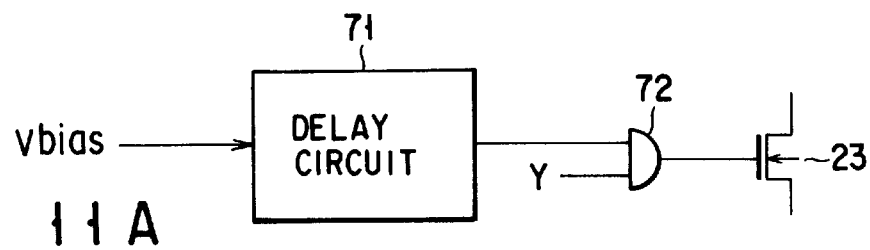
FIGS. 11A and 11B are diagrams showing a signal delay circuit unit which may be used in the EPROM of FIG. 5, and the waveforms concerning the signal delay circuit unit.
Figure 11B:
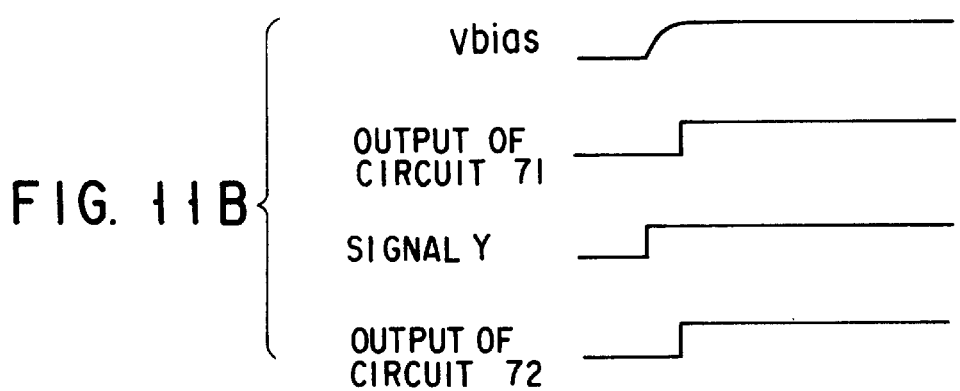

FIG. 11A shows a delay circuit unit which may be used in the EPROM to prohibit the column selecting signal Y from rising from "L" level to "H" level, so as to achieve the measure (1). FIG. 11B represents the waveforms of the outputs of the components of the signal delay circuit 71.

As illustrated in FIG. 11A, the delay circuit unit comprises a delay circuit 71 and two-input AND circuit 72. The output voltage Vbias of the constant-voltage generating circuit is input to the delay circuit 71. The circuit 71 outputs a control signal after the voltage Vbias becomes stable. The control signal is supplied to the first input of the AND circuit 72. The selecting signal Y (i.e., the output signal of the column decoder 15) is supplied to the second input of the AND circuit 72. The AND circuit 72 generates a logical product of the control signal and the column selecting signal Y. The logical product is supplied to the gate of the column-selecting MOS transistor 23 which is shown in FIG. 6.

If provided with the delay circuit unit shown in FIG. 11A, the EPROM will comprise a memory cell array, a column selecting switch, a sense amplifier circuit, MOS transistors, and a bit-line bias circuit. The memory cell array, column selecting switch and sense amplifier circuit are identical to those shown in FIG. 5. The MOS transistors are provided between the column selecting switch and the sense amplifier circuit. The delay circuit unit delays the timing of raising the column selecting signal Y for controlling the column selecting switch, until the output voltage of the bit-line bias circuit becomes stable.

Figure 12A:
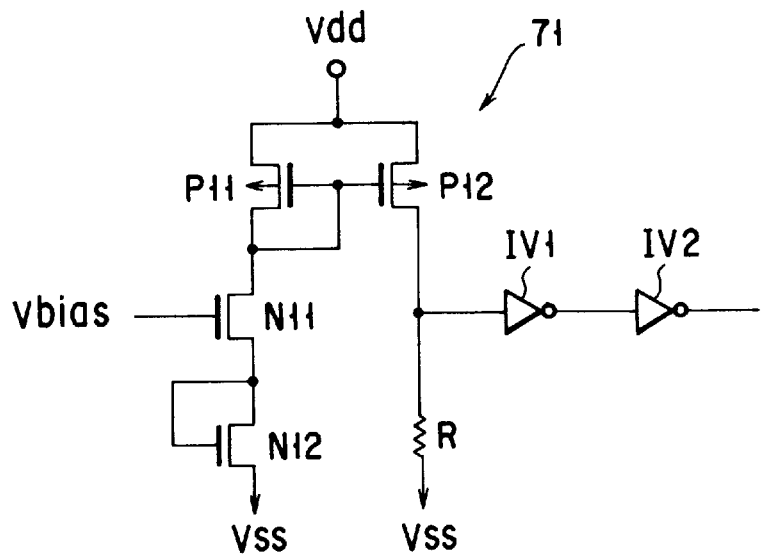
FIGS. 12A and 12B are circuit diagrams showing two alternatives for the column-selecting delay circuit shown in FIG. 11A.
Figure 12B:
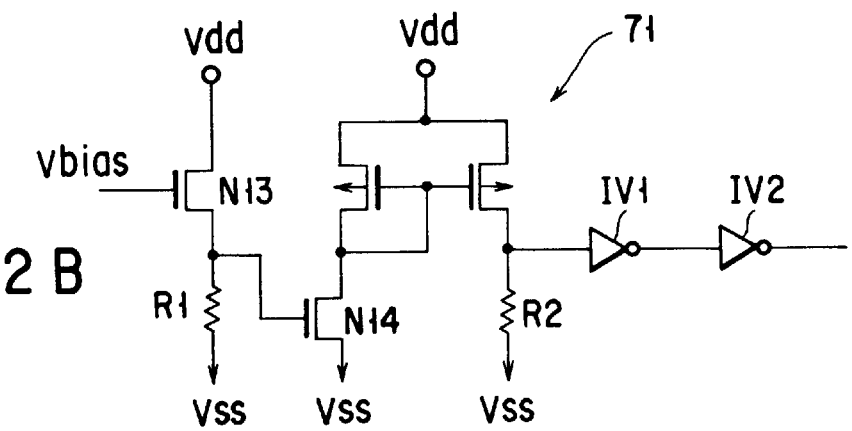

The delay circuit unit shown in FIG. 11A can be replaced by the modified one shown in FIG. 12A or the modified one shown in FIG. 12B.

In the circuit unit of FIG. 12A, the output voltage Vbias of the constant-voltage generating circuit is applied to the gate of an NMOS transistor N11. An NMOS transistor N12 is connected the source of the NMOS transistor N11 and the Vss node. The drain and gate of the NMOS transistor 12 are connected to each other. A PMOS transistor P11 has its drain and gate connected to each other, and its source-drain path connected between the Vdd node and the drain of the NMOS transistor N11. The PMOS transistor P11 and a PMOS transistor P12 constitute a current mirror circuit. The PMOS transistor P12 has its source connected to the Vdd node, and its gate connected to the gate of the PMOS transistor P11. A resistor R is connected between the source of the PMOS transistor P12 and the Vss node. Two inverters IV1 and IN2 are connected in series, with the inverter IV1 connected to the node of the PMOS transistor P12 and the resistor R.

In the circuit unit of FIG. 12B, an NMOS transistor N13 and a resistor R1 is connected in series between the Vdd node and the Vss node, forming a source follower circuit. The voltage Vbias is applied to the source follower circuit. The output of the source circuit is input to the gate of an NMOS transistor N14. The source of the NMOS transistor N14 is connected to the node N14. A PMOS transistor P11, whose drain and gate are coupled, has its source-drain path connected to the Vdd node and the drain of the NMOS transistor N13. The PMOS transistor P11 and a PMOS transistor P12 constitute a current mirror circuit. The PMOS transistor P12 has its source connected to the Vdd node, and its gate connected to the gate of the PMOS transistor P11. A resistor R2 is connected between the source of the PMOS transistor P12 and the Vss node. Two inverters IV1 and IN2 are connected in series, with the inverter IV1 connected to the node of the PMOS transistor P12 and the resistor R.

Figure 13:
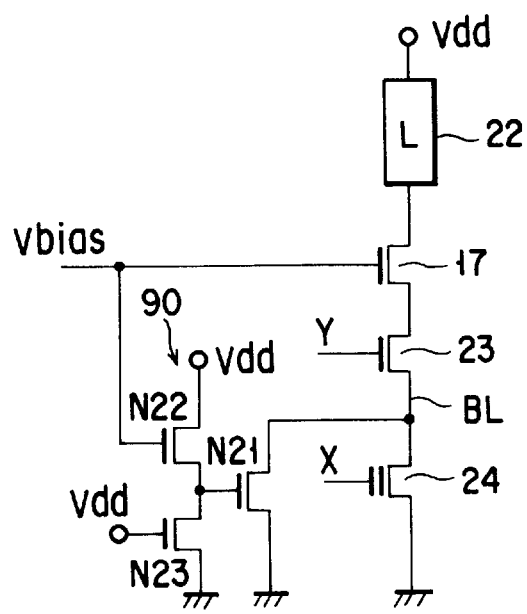
FIG. 13 is a circuit diagram illustrating a bit-line leakage current circuit which may be used in the EPROM of FIG. 5.

FIG. 13 shows a bit-line current leakage circuit which may be used in the EPROM to make a leakage current flow from the bit line to the ground node, so as to achieve the measure (2).

As shown FIG. 13, an NMOS transistor N21 is connected between the bit line and the ground node and used as the leakage current source. A drive circuit 90 is provided which receives the output voltage Vbias of the constant-voltage generating circuit and which generates a control signal. The control signal turns on the NMOS transistor N21 until the voltage Vbias becomes stable. The drive circuit 90 comprises NMOS transistor N22 and N23 which are connected in series between the Vdd node and the Vss node. The NMOS transistor N22 has its gate connected to receives the voltage Vbias. The NMOS transistor N23 has its gate connected to receive the Vdd potential.

The drive circuit 90 may be of the structure shown in FIG. 14. The drive circuit 90 has some inverter circuits and the like composed of MOS transistors for adjusting the waveform of the inputted voltage Vbias to apply an outputted voltage to the NMOS transistor N21 which is used as the leakage current source.

FIGS. 15A to 15C illustrate how the voltages Vbias, VS1 and VS2 change in the circuit 90 immediately after the control signal SW rises from "L" level to "H" level.

If provided with the bit-line current leakage circuit shown in FIG. 13, the EPROM will comprise a memory cell array, a column selecting switch, a amplifier circuit, MOS transistors, and a bit-line bias circuit. The memory cell array, column selecting switch and amplifier circuit are identical to those shown in FIG. 5. The MOS transistors are provided between the column selecting switch and the amplifier circuit. The bit-line current leakage circuit supplies a leakage current from the bit line to the ground node until the output voltage of the bit-line bias circuit becomes stable.

FIG. 16 shows the constant-voltage generating circuit having a power-supply voltage decreasing circuit which is used to achieve the measure (3).

As seen from FIG. 16, the circuit 100 lowers the power-supply voltage Vcc applied from an external device, generating an internal voltage Vdd. The internal voltage Vdd is applied to the constant-voltage generating circuit.

If provided with the power-supply voltage decreasing circuit 100, the EPROM will comprise a memory cell array, a column selecting switch, a amplifier circuit, MOS transistors, and a bit-line bias circuit. The memory cell array, column selecting switch and amplifier circuit are identical to those shown in FIG. 5. The MOS transistors are provided between the column selecting switch and the amplifier circuit. The circuit 100 lowers the power-supply voltage Vcc, generating an internal voltage Vdd, and the internal voltage Vdd is applied to the bit-line bias circuit.

FIGS. 17A and 17B show two examples of the voltage-decreasing circuit 100.

The voltage-decreasing circuit shown in FIG. 17A comprises a differential amplifier 111 and a feedback circuit 112, and an enhancement-type PMOS transistor 113. A reference potential VR is applied to the first input terminal of the differential amplifier 111, and a feedback voltage VB is applied to the second input terminal of the amplifier 111 from the feedback circuit 112. The feedback circuit 112 is connected between the second input terminal and output terminal of the amplifier 111. Controlled by the output of the amplifier 111, the feedback circuit 112 generates a control voltage VA which is higher than the reference potential VR by the threshold voltage Vtn of one enhancement-type NMOS transistor. The PMOS transistor 113 has its gate connected to receive the control voltage VA and its drain-source path connected between the Vdd node and the Vddint node (i.e., the node from which the internal voltage Vdd).

The feedback circuit 112 comprises an enhancement-type P-channel transistor P41, an enhancement-type N-channel transistor N41, and two resistors R3 and R4 having high resistance. The P-channel transistor P41 has its source connected to the Vdd node. The N-channel transistor N41 has its drain and gate connected to each other. The N-channel transistor 41 and the resistors R3 and R4 are connected in series between the drain of the P-channel transistor P41 and the ground potential. The voltage at the node of the resistors R3 and R4 is applied to the second input terminal of the differential amplifier 111. The control voltage VA is applied from the node of the P-channel transistor P41 and the N-channel transistor N41.

How the voltage-decreasing circuit of FIG. 17A operates will be explained.

The output of the differential amplifier 111 remains at "L" level while VR>VB, and at "H" while VR<VB. The P-channel transistor P41 remains on while its gate input stays at "L" level, and remains off while its gate input stays at "H" level. As long as the P-channel transistor P41 is on, the control voltage VA and the feedback voltage VB are pulled up. As long as the P-channel transistor P41 is off, the control voltage VA and the feedback voltage VB are pulled down. In other words, feedback control is performed until the feedback voltage VB becomes equal to the reference potential VR. The currents flowing through the resistors R3 and R4 are very small. Hence, VA=VR+Vtn, that is, the control voltage VA is stable, provided that the N-channel transistor N41 has a sufficient channel width. An internal voltage Vddint is obtained which is equal to VA−Vtn, i.e., the reference potential VR.

The voltage-decreasing circuit shown in FIG. 17B is more simple than the circuit of FIG. 17A because it has no components equivalent to the N-channel transistor N41 and the PMOS transistor 113. The circuit of FIG. 17B operates essentially in the same way as the circuit of FIG. 17A.

As has been described above, the present invention can provide a nonvolatile semiconductor memory device which has a relatively small chip, which can be manufactured at low cost and which can be accessed at high speed, and also a constant-voltage generating circuit for use in the nonvolatile semiconductor memory device.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the invention can be applied not only to an EPROM, but also to a NAND-type EEPROM, a NOR-type EEPROM and the like.

I claim:

1. A constant-current generating circuit comprising:
    a first PMOS transistor having a source to which a predetermined voltage according to a voltage of a first power-supply node is supplied and a gate and a drain both connected to a first node;
    a second PMOS transistor having a source to which a predetermined voltage according to the voltage of the first power-supply node is supplied, a gate connected to the first node, and a drain connected to a second node which is an output node, said second PMOS transistor constituting a current mirror circuit, jointly with the first PMOS transistor;
    a first NMOS transistor having a drain connected to said first node, a gate connected to said second node, and a source connected to a second power-supply node;
    a second NMOS transistor having a drain and a gate both connected to said second node and a source connected to a third node;
    an active element connected between said third node and said second power-supply node; and
    a control circuit for setting said first and second nodes at the potential of said second power-supply node and deactivating said current mirror circuit in accordance with a control signal supplied from external of the control circuit being inactive, and for releasing said first and second nodes from the potential of said second power-supply node and activating said current mirror circuit in accordance with the control signal being active.

2. A circuit according to claim 1, wherein the active element is a third NMOS transistor which has a drain and a gate both connected to said third node, and a source connected to said second power-supply node.

3. A circuit according to claim 1, wherein said control circuit sets said first node at the potential of said second power-supply node in accordance with the control signal being inactive, and releases said first node from the potential of said second power-supply node and slowly changes the potential of the first node in accordance with the control signal being active.

4. A circuit according to claim 3, wherein said control circuit includes:
    a third PMOS transistor having a source-drain path connected between a power-supplying node and said first power-supply node, and a gate connected to receive a signal generated by inverting the control signal;
    a fourth NMOS transistor having a drain-source path connected between said first node and said second power-supply node, and a gate connected to receive the signal generated by inverting the control signal;
    a fifth NMOS transistor having a drain-source path connected between said second node and said second power-supply node, and a gate connected to receive the signal generated by inverting the control signal; and
    a first capacitor connected between said first node and said second power-supply node.

5. A circuit according to claim 4, wherein a ratio between capacitance C1 of said first capacitor and capacitance C2 of a second capacitor which is a parasitic capacitance of said second node is equal to a ratio between the mutual conductances of said first and second PMOS transistors.

6. A circuit according to claim 4, wherein a ratio between the mutual conductances of said fourth and fifth NMOS transistors is equal to a ratio between the capacitance C2 of a second capacitor which is a parasitic capacitance of said second node and the capacitance C1 of said first node.

7. A circuit according to claim 1, further comprising a sixth NMOS transistor having a drain-source path connected between said second node and said second power-supply node, and a gate connected to receive a signal from said third node.

8. A constant-voltage generating circuit comprising:
- a first PMOS transistor having a source to which a predetermined voltage according to a voltage of a first power-supply node is supplied and a gate and a drain both connected to a first node;
- a second PMOS transistor having a source to which a predetermined voltage according to the voltage of the first power-supply node is supplied, a gate connected to the first node, and a drain connected to a second node which is an output node, said second PMOS transistor constituting a current mirror circuit, jointly with the first PMOS transistor;
- a first NMOS transistor having a drain connected to said first node, a gate connected to a third node, and a source connected to a second power-supply node;
- a second NMOS transistor having a drain and a gate both connected to said second node and a source connected to said third node;
- a third NMOS transistor having a drain and gate connected to said third node, and a source connected to said second power-supply node; and
- a control circuit for setting said first and second nodes at the potential of said second power-supply node and deactivating said current mirror circuit in accordance with a control signal supplied from external of the control circuit being inactive, and for releasing said first and second nodes from the potential of said second power-supply node and activating said current mirror circuit in accordance with the control signal being active.

9. A circuit according to claim 8, wherein said control circuit sets said first node at the potential of said second power-supply node in accordance with the control signal being inactive, and releases said first node from the potential of said second power-supply node and slowly changes the potential of the first node in accordance with the control signal being active.

10. A circuit according to claim 9, wherein said control circuit includes:
- a third PMOS transistor having a source-drain path connected between a power-supplying node and said first power-supply node, and a gate connected to receive a signal generated by inverting the control signal;
- a fourth NMOS transistor having a drain-source path connected between said first node and said second power-supply node, and a gate connected to receive the signal generated by inverting the control signal;
- a fifth NMOS transistor having a drain-source path connected between said second node and said second power-supply node, and a gate connected to receive the signal generated by inverting the control signal; and
- a first capacitor connected between said first node and said second power-supply node.

11. A circuit according to claim 10, wherein a ratio between capacitance C1 of said first capacitor and the capacitance C2 of a second capacitor which is a parasitic capacitance of said second node is equal to a ratio between the mutual conductances of said first and second PMOS transistors.

12. A circuit according to claim 10, wherein a ratio between the mutual conductances of said fourth and fifth NMOS transistors is equal to a ratio between the capacitance C2 of a second capacitor which is a parasitic capacitance of said second node and the capacitance C1 of said first node.

13. A circuit according to claim 8, further comprising a sixth NMOS transistor having a drain-source path connected between said second node and said second power-supply node, and a gate connected to receive a signal from said third node.

* * * * *